(12) United States Patent
Nakatani

(10) Patent No.: US 10,276,393 B2
(45) Date of Patent: Apr. 30, 2019

(54) METHOD OF MANUFACTURING SEMICONDUCTOR DEVICE

(71) Applicant: HITACHI KOKUSAI ELECTRIC INC., Tokyo (JP)

(72) Inventor: Kimihiko Nakatani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/546,136

(22) PCT Filed: Jan. 26, 2015

(86) PCT No.: PCT/JP2015/051965
§ 371 (c)(1),
(2) Date: Dec. 15, 2017

(87) PCT Pub. No.: WO2016/120957
PCT Pub. Date: Aug. 4, 2016

(65) Prior Publication Data
US 2018/0130664 A1    May 10, 2018

(51) Int. Cl.
| | |
|---|---|
| *H01L 21/44* | (2006.01) |
| *H01L 21/285* | (2006.01) |
| *C23C 16/04* | (2006.01) |
| *C23C 16/14* | (2006.01) |
| *C23C 16/455* | (2006.01) |
| *C23C 16/56* | (2006.01) |

(52) U.S. Cl.
CPC ........ *H01L 21/28562* (2013.01); *C23C 16/04* (2013.01); *C23C 16/045* (2013.01); *C23C 16/14* (2013.01); *C23C 16/45525* (2013.01); *C23C 16/56* (2013.01); *H01L 21/285* (2013.01)

(58) Field of Classification Search
CPC .... H01L 21/28; H01L 21/28562; C23C 16/04
USPC ........................................................ 438/674
See application file for complete search history.

(56) References Cited

U.S. PATENT DOCUMENTS

| | | | |
|---|---|---|---|
| 6,391,785 B1 | 5/2002 | Satta et al. | |
| 6,475,276 B1 | 11/2002 | Elers et al. | |
| 6,482,262 B1 | 11/2002 | Elers et al. | |
| 6,664,192 B2 | 12/2003 | Satta et al. | |
| 6,727,169 B1 | 4/2004 | Raaijmakers et al. | |
| 6,800,552 B2 | 10/2004 | Elers et al. | |
| 6,821,889 B2 | 11/2004 | Elers et al. | |
| 6,852,635 B2 | 2/2005 | Satta et al. | |
| 7,102,235 B2 | 9/2006 | Raaijmakers et al. | |
| 7,144,809 B2 | 12/2006 | Elers et al. | |

(Continued)

FOREIGN PATENT DOCUMENTS

| | | |
|---|---|---|
| JP | 2005-531918 A | 10/2005 |
| JP | 2008-078647 A | 4/2008 |

(Continued)

OTHER PUBLICATIONS

International Search Report of PCT International Application No. PCT/JP2015/051965.

*Primary Examiner* — David S Blum
(74) *Attorney, Agent, or Firm* — Volpe and Koenig, P.C.

(57) ABSTRACT

In a method of manufacturing a semiconductor device, by performing a predetermined number of times a cycle of performing supplying reducing gas to a substrate having an insulating surface and a conductive surface and supplying metal-containing gas to the substrate in a time-division manner, a metal film is formed selectively on an insulating surface.

14 Claims, 9 Drawing Sheets

(56) References Cited

U.S. PATENT DOCUMENTS

| | | |
|---|---|---|
| 7,329,590 B2 | 2/2008 | Elers et al. |
| 7,485,340 B2 | 2/2009 | Elers et al. |
| 7,670,944 B2 | 3/2010 | Raaijmakers et al. |
| 7,749,871 B2 | 7/2010 | Elers et al. |
| 2002/0155722 A1 | 10/2002 | Satta et al. |
| 2003/0224578 A1 | 12/2003 | Chung et al. |
| 2009/0053893 A1 | 2/2009 | Khandelwal et al. |
| 2009/0081866 A1 | 3/2009 | Lee et al. |
| 2013/0084700 A1 | 4/2013 | Swerts et al. |
| 2013/0243956 A1 | 9/2013 | Ma |

FOREIGN PATENT DOCUMENTS

| | | |
|---|---|---|
| JP | 2009-024252 A | 2/2009 |
| JP | 2013-079447 A | 5/2013 |

METHOD OF MANUFACTURING SEMICONDUCTOR DEVICE

BACKGROUND

Field of the Invention

The present invention relates to a method of manufacturing a semiconductor device.

Description of the Related Art

As a process in a process of manufacturing a semiconductor device, a process of forming a metal film on a substrate is performed in some cases. Also, the metal film is to be formed selectively on a predetermined region on the substrate in some cases.

SUMMARY OF THE INVENTION

An object of the present invention is to provide a new technique that can be applied to selective formation of a metal film on a predetermined region on a substrate.

According to an aspect of the present invention, there is provided a method of manufacturing a semiconductor device, including performing a cycle a predetermined number of times to form a metal film selectively on an insulating surface, the cycle including:

supplying reducing gas to a substrate having the insulating surface and a conductive surface, and supplying metal-containing gas to the substrate, wherein the supplying reducing gas and the supplying metal-containing gas are performed in a time-division manner.

A metal film can be formed selectively on an insulating surface of a substrate having the insulating surface and a conductive surface.

DETAILED DESCRIPTION

One Embodiment of Present Invention

Figure 1:
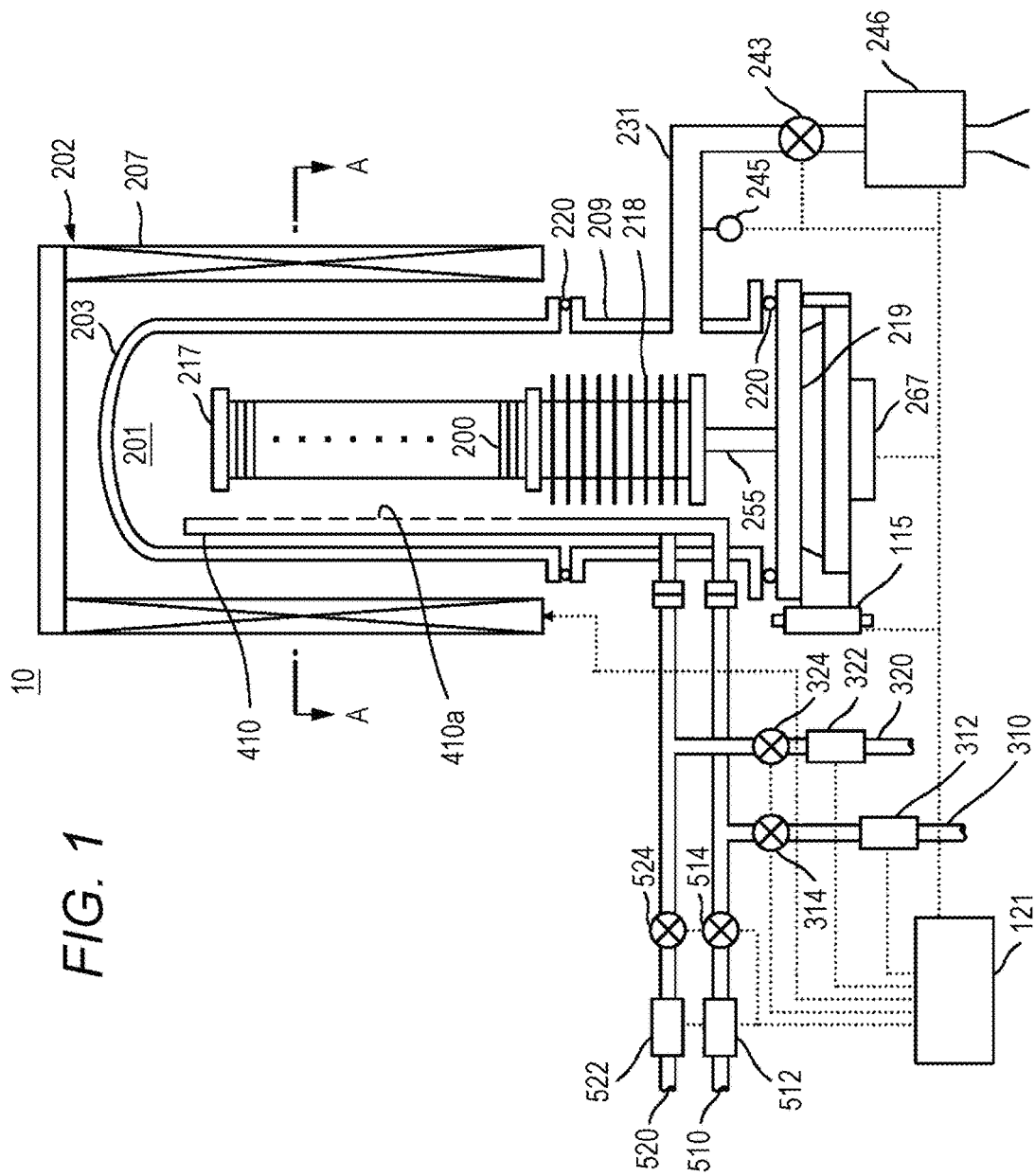
FIG. 1 is a schematic configuration diagram of a processing furnace of a substrate processing apparatus suitably used in an embodiment of the present invention and is a vertical cross-sectional view of the processing furnace part.

Hereinbelow, an embodiment of the present invention will be described with reference to FIGS. 1 and 2. A substrate processing apparatus 10 is configured as an example of an apparatus for use in a substrate processing process serving as a process in a process of manufacturing a semiconductor device.

(1) Configuration of Processing Furnace

A processing furnace 202 is provided with a heater 207 serving as a heating means (a heating mechanism or a heating system). The heater 207 is formed in a cylindrical shape with an upper side thereof closed.

Inside the heater 207, a reaction tube 203 constituting a reaction container (processing container) is arranged to be concentric to the heater 207. The reaction tube 203 is made of a heat-resistant material or the like (for example, quartz ($SiO_2$) or silicon carbide (SiC)) and is formed in a cylindrical shape with an upper end thereof closed and with a lower end thereof opened.

To the lower end of the reaction tube 203, a manifold 209 made of a metal material such as stainless steel is attached. The manifold 209 is formed in a tubular shape, and a lower end opening thereof is closed in an airtight manner by a seal cap 219 serving as a lid made of a metal material such as stainless steel. Between the reaction tube 203 and the manifold 209 and between the manifold 209 and the seal cap 219, O rings 220 serving as seal members are respectively provided. Mainly, the processing container is constituted by the reaction tube 203, the manifold 209, and the seal cap 219, and a processing chamber 201 is formed inside this processing container. The processing chamber 201 is configured to enable wafers 200 serving as substrates to be housed therein by a below-mentioned boat 217 in a leveled, multiple, and aligned state in a vertical direction.

On a side of the seal cap 219, which is an opposite side of a side on which the processing chamber 201 is located, a rotating mechanism 267 for rotating the boat 217 is provided. A rotating shaft 255 of the rotating mechanism 267 passes through the seal cap 219 and is connected to the boat 217. The rotating mechanism 267 is configured to rotate the boat 217 to cause the wafers 200 to be rotated. The seal cap 219 is configured to be elevated in the vertical direction by a boat elevator 115 serving as an elevating mechanism installed vertically outside the reaction tube 203. The boat elevator 115 is configured to enable the boat 217 to be loaded and unloaded into and out of the processing chamber 201 by elevating the seal cap 219. That is, the boat elevator 115 is configured as a transfer unit (transfer mechanism) for transferring the boat 217 or the wafers 200 into and out of the processing chamber 201.

The boat 217 serving as a substrate retainer is configured to align and support a plurality of, 25 to 200, for example, wafers 200 in a vertical direction in a leveled, coaxial, and multiple state, that is, to arrange the wafers 200 at intervals. The boat 217 is made of a heat-resistant material or the like (for example, quartz or SiC). At a lower portion of the boat 217, heat-resistant plates 218 made of a heat-resistant material or the like (for example, quartz or SiC) are supported in a leveled state in a multiple manner. This configuration restricts heat conduction from the heater 207 to the side of the seal cap 219. However, the present embodiment is not limited to the above embodiment. For example, the heat-resistant plates 218 may not be provided at the lower portion of the boat 217, and a heat-resistant barrel configured as a tubular member made of a heat-resistant material such as quartz and SiC may be provided. The heater 207 can heat the wafers 200 housed in the processing chamber 201 at a predetermined temperature.

In the processing chamber 201, nozzles 410 and 420 are provided to pass through a sidewall of the manifold 209. To the nozzles 410 and 420, gas supply pipes 310 and 320 serving as gas supply lines are connected, respectively. In this manner, the processing furnace 202 is provided with the two nozzles 410 and 420 and the two gas supply pipes 310 and 320 and is configured to enable plural kinds of gas, two kinds of gas (processing gas) in the present embodiment, to be supplied into the processing chamber 201 through dedicated lines, respectively.

The gas supply pipes 310 and 320 are provided with mass flow controllers (MFCs) 312 and 322 serving as flow rate controllers (flow rate control units) and valves 314 and 324 serving as opening/closing valves in this order from an upstream side, respectively. To tip end portions of the gas supply pipes 310 and 320, nozzles 410 and 420 are connected, respectively. Each of the nozzles 410 and 420 is configured as an L-shaped long nozzle, and a horizontal portion thereof is provided to pass through the sidewall of the manifold 209. A vertical portion of each of the nozzles 410 and 420 is provided to erect to an upper side (an upper side in a direction of mounting the wafers 200) (that is, to erect from one end side to the other end side of a wafer arranging region) along an inner wall of the reaction tube 203 in an annular space formed between the inner wall of the reaction tube 203 and the wafers 200. That is, the nozzles 410 and 420 are provided in a region horizontally surrounding the wafer arranging region on a lateral side of the wafer arranging region in which the wafers 200 are arranged to go along the wafer arranging region.

On side surfaces of the nozzles 410 and 420, gas supply holes 410a and 420a for supplying (ejecting) gas are provided, respectively. The respective gas supply holes 410a and 420a are opened to face the center of the reaction tube 203. The plurality of gas supply holes 410a and 420a are provided in a range from a lower portion to an upper portion of the reaction tube 203, have equal opening areas, and are provided to have equal opening pitches.

In this manner, in a method of supplying gas in the present embodiment, gas is transferred via the nozzles 410 and 420 arranged in the annular longitudinal space defined by the inner wall of the reaction tube 203 and the end portions of the plurality of mounted wafers 200, that is, in the cylindrical space, and is ejected inside the reaction tube 203 for the first time in the vicinity of the wafers 200 from the gas supply holes 410a and 420a opened in the nozzles 410 and 420, respectively. The main flow of gas in the reaction tube 203 is in a direction parallel to the surfaces of the wafers 200, that is, in the horizontal direction. Such a configuration brings about an effect of enabling gas to be supplied to the respective wafers 200 uniformly and enabling film thickness of a thin film to be formed on each wafer 200 to be uniform. Gas that has flown on the surface of each wafer 200, that is, gas remaining after a reaction (residual gas), flows in a direction toward an exhaust port, that is, a below-mentioned exhaust pipe 231. The direction in which the residual gas flows is specified in an appropriate manner depending on the position of the exhaust port and is not limited to the vertical direction.

Also, to the gas supply pipes 310 and 320, carrier gas supply pipes 510 and 520 for supplying carrier gas are connected, respectively. The carrier gas supply pipes 510 and 520 are provided with MFCs 512 and 522 and valves 514 and 524, respectively.

As an example in the above configuration, from the gas supply pipe 310, material gas containing a metal element (a metal-containing material, metal-containing gas, or a metal material) is supplied as processing gas into the processing chamber 201 via the MFC 312, the valve 314, and the nozzle 410. An example of the material gas to be used is tungsten hexafluoride ($WF_6$) gas serving as tungsten (W)-containing material gas containing W as a metal element. The $WF_6$ gas acts as a W source in a below-mentioned substrate processing process.

From the gas supply pipe 320, reducing gas serving as reaction gas is supplied as processing gas into the processing chamber 201 via the MFC 322, the valve 324, and the nozzle 420. An example of the reducing gas to be used is diborane ($B_2H_6$) serving as boron (B)-containing gas. The $B_2H_6$ gas acts as a B source in the below-mentioned substrate processing process.

From the carrier gas supply pipes 510 and 520, nitrogen ($N_2$) gas, for example, is supplied as inert gas into the processing chamber 201 via the MFCs 512 and 522, the valves 514 and 524, and the nozzles 410 and 420, respectively. It is to be noted that an example in which the $N_2$ gas is used as inert gas will be described below, and that rare gas such as argon (Ar) gas, helium (He) gas, neon (Ne) gas, and xenon (Xe) gas may be used as inert gas, instead of the $N_2$ gas.

In the present description, each of processing gas, material gas, and reducing gas is a gaseous source or a gaseous reducing agent such as gas obtained by vaporizing or sublimating a source or a reducing agent which is liquid or solid at ordinary temperatures and pressures or a source or a reducing agent which is gaseous at ordinary temperatures and pressures. In the present description, in a case in which the term "source" is used, the term may mean "a liquid source which is liquid," "a solid source which is solid," "material gas which is gaseous," or combination thereof. In the present description, in a case in which the term "reducing agent" is used, the term may mean "a liquid reducing agent which is liquid," "a solid reducing agent which is solid," "reducing gas which is gaseous," or combination thereof. In a case in which the liquid source or the like which is liquid at ordinary temperatures and pressures or the solid source or the like which is solid at ordinary temperatures and pressures is used, the liquid source or the like or the solid source or the like will be vaporized or sublimated by a system such as a vaporizer, a bubbler, and a sublimator and will be supplied as material gas or reducing gas.

In a case in which the aforementioned processing gas is supplied from the gas supply pipes 310 and 320, the gas supply pipes 310 and 320, the MFCs 312 and 322, and the valves 314 and 324 mainly constitute a processing gas supply system. The nozzles 410 and 420 may be included in the processing gas supply system. The processing gas supply system can be referred to simply as a gas supply system.

In a case in which the aforementioned processing gas is supplied from the gas supply pipe 310, the gas supply pipe 310, the MFC 312, and the valve 314 mainly constitute a material gas supply system. The nozzle 410 may be included in the material gas supply system. The material gas supply system can be referred to as a source supply system.

In a case in which the W-containing gas is supplied as the material gas from the gas supply pipe 310, the gas supply pipe 310, the MFC 312, and the valve 314 mainly constitute a W-containing gas supply system. The nozzle 410 may be included in the W-containing gas supply system. The W-containing gas supply system can be referred to as a W-containing source supply system or simply as a W source supply system. In a case in which the $WF_6$ gas is supplied from the gas supply pipe 310, the W-containing gas supply system can be referred to as a $WF_6$ gas supply system. The $WF_6$ gas supply system can be referred to as a $WF_6$ supply system.

In a case in which the aforementioned reducing gas is supplied as the reaction gas from the gas supply pipe 320, the gas supply pipe 320, the MFC 322, and the valve 324 mainly constitute a reducing gas supply system serving as a reaction gas supply system. The nozzle 420 may be included in the reducing gas supply system. The reducing gas supply system can be referred to as a reducing agent supply system.

In a case in which the B-containing gas is supplied as the reducing gas from the gas supply pipe 320, the gas supply pipe 320, the MFC 322, and the valve 324 mainly constitute a B-containing gas supply system. The nozzle 420 may be included in the B-containing gas supply system. The B-containing gas supply system can be referred to as a B-containing reducing gas supply system or as a B-containing reducing agent supply system. In a case in which the $B_2H_6$ gas is supplied from the gas supply pipe 320, the B-containing gas supply system can be referred to as a $B_2H_6$ gas supply system. The $B_2H_6$ gas supply system can be referred to as a $B_2H_6$ supply system.

Also, the carrier gas supply pipes 510 and 520, the MFCs 512 and 522, and the valves 514 and 524 mainly constitute a carrier gas supply system. In a case in which inert gas is supplied as the carrier gas, the carrier gas supply system can be referred to as an inert gas supply system. Since this inert gas also acts as purge gas, the inert gas supply system can be referred to as a purge gas supply system.

The manifold 209 is provided with the exhaust pipe 231 for exhausting atmosphere in the processing chamber 201. Similarly to the nozzles 410 and 420, the exhaust pipe 231 is provided to pass through the sidewall of the manifold 209. As illustrated in FIG. 2, the exhaust pipe 231 is provided at a position opposed to the nozzles 410 and 420 with the wafers 200 interposed between the exhaust pipe 231 and the nozzles 410 and 420 in a planar view. With this configuration, gas supplied from the gas supply holes 410a and 420a in the vicinity of the wafers 200 in the processing chamber 201 flows in the horizontal direction, that is, in the direction parallel to the surfaces of the wafers 200, then flows downward, and is exhausted from the exhaust pipe 231. As described above, the main flow of gas in the processing chamber 201 is a flow in the horizontal direction.

To the exhaust pipe 231, a pressure sensor 245 serving as a pressure detector (pressure detection unit) for detecting pressure in the processing chamber 201, an auto pressure controller (APC) valve 243 serving as a pressure controller (pressure control unit) for controlling pressure in the processing chamber 201, and a vacuum pump 246 serving as a vacuum exhaust unit are connected in this order from the upstream side. The APC valve 243 is configured to enable vacuum exhaust and vacuum exhaust stop in the processing chamber 201 to be performed by opening/closing the valve in a state in which the vacuum pump 246 is operated and to enable pressure in the processing chamber 201 to be regulated by adjusting the degree of valve opening based on pressure information detected by the pressure sensor 245 in a state in which the vacuum pump 246 is operated. The APC valve 243 constitutes a part of an exhaust flow path of an exhaust system and functions not only as a pressure regulation unit but also as an exhaust flow path opening/closing unit enabling the exhaust flow path of the exhaust system to be closed or sealed, that is, an exhaust valve. Also, the exhaust pipe 231 is connected to a trap unit for trapping a reaction by-product, unreacted material gas, and the like in the exhaust gas and an abatement unit for abating a corrosive component, a toxic component, and the like in the exhaust gas in some cases. The exhaust pipe 231, the APC valve 243, and the pressure sensor 245 mainly constitute an exhaust system or an exhaust line. The vacuum pump 246 may be included in the exhaust system. Further, the trap unit and the abatement unit may be included in the exhaust system.

In the reaction tube 203, a temperature sensor 263 serving as a temperature detector is installed. The temperature sensor 263 is configured, by adjusting the amount of power to be supplied to the heater 207 based on temperature information detected by the temperature sensor 263, to cause the temperature in the processing chamber 201 to have a desired temperature distribution. The temperature sensor 263 is formed in an L shape in a similar manner to those of the nozzles 410 and 420 and is provided along the inner wall of the reaction tube 203.

Figure 3:
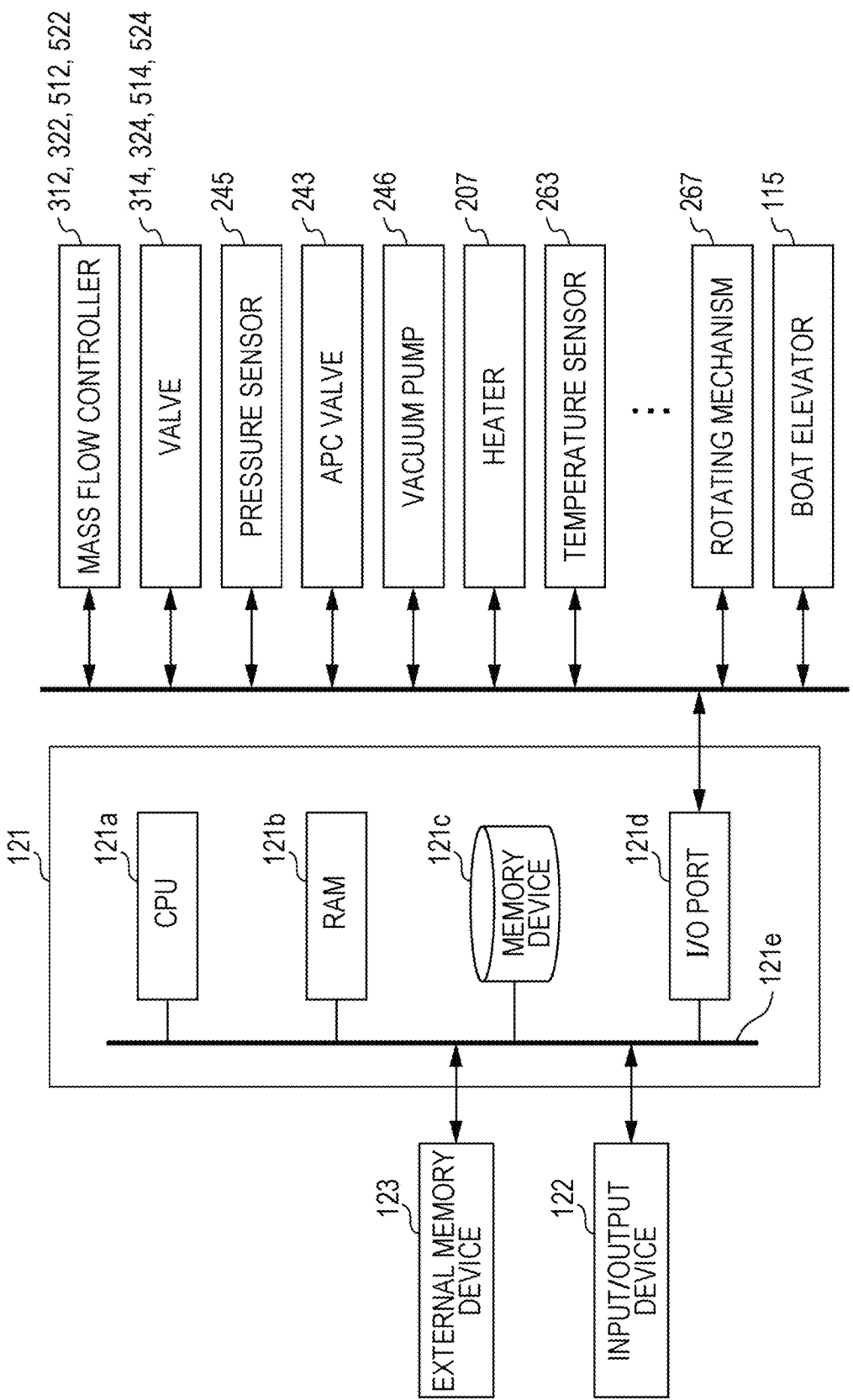
FIG. 3 is a block diagram illustrating a configuration of a controller included in the substrate processing apparatus illustrated in FIG. 1.

As illustrated in FIG. 3, a controller 121 serving as a control unit (control means) is configured as a computer including a central processing unit (CPU) 121a, a random access memory (RAM) 121b, a memory device 121c, and an I/O port 121d. The RAM 121b, the memory device 121c, and the I/O port 121d are configured to enable data exchange with the CPU 121a via an internal bus 121e. To the controller 121 is connected an input/output device 122 configured as a touch panel or the like.

The memory device 121c is configured as a flash memory, a hard disk drive (HDD), or the like. In the memory device 121c, a control program for controlling operations of the substrate processing apparatus, a process recipe describing procedures, conditions, and the like of below-mentioned substrate processing, and the like are stored to be readable. The process recipe is one in which respective steps of the below-mentioned substrate processing are sequenced to make the controller 121 execute the respective steps and achieve a predetermined result, and functions as a program. Hereinbelow, the process recipe, the control program, and the like are collectively referred to simply as a program. When the term "program" is used in the present description, the program may include only the process recipe, only the control program, or both. The RAM 121b is configured as a memory area (work area) in which programs, data, and the like read out by the CPU 121a are temporarily held.

The I/O port 121d is connected to the aforementioned MFCs 312, 322, 512, and 522, valves 314, 324, 514, and 524, APC valve 243, pressure sensor 245, vacuum pump 246, heater 207, temperature sensor 263, rotating mechanism 267, boat elevator 115, and the like.

The CPU 121a is configured to read out the control program from the memory device 121c to execute the control program and read out the process recipe from the memory device 121c in accordance with an input or the like of an operation command through the input/output device 122. The CPU 121a is configured to control various gas flow rate control operations by the MFCs 312, 322, 512, and 522, opening/closing operations of the valves 314, 324, 514, and 524, opening/closing operations of the APC valve 243 and pressure regulation operations by the APC valve 243 based on the pressure sensor 245, temperature adjustment operations of the heater 207 based on the temperature sensor 263, start/stop of the vacuum pump 246, rotation and rotating speed adjustment operations of the boat 217 by the rotating mechanism 267, elevating operations of the boat 217 by the boat elevator 115, and the like in accordance with the read process recipe.

The controller 121 may also be configured as a general-purpose computer, not only as a dedicated computer. For example, the controller 121 according to the present embodiment can be configured by installing in a general-purpose computer the aforementioned program with use of an external memory device 123 (e.g., a magnetic disk such as a magnetic tape, a flexible disk, and a hard disk, an optical disk such as a CD and a DVD, a magneto-optical disk such as an MO, and a semiconductor memory such as a USB memory and a memory card) 123 having stored the program therein. A means to supply the computer with the program is not limited to supplying via the external memory device 123. For example, the program may be provided not with use of the external memory device 123 but with use of a communication means such as the Internet and a dedicated line connection. Each of the memory device 121c and the external memory device 123 is configured as a non-transitory computer-readable recording medium. Hereinbelow, each of these memory devices is collectively referred to simply as a recording medium. When the term "recording medium" is used in the present description, the recording medium may include only the memory device 121c, only the external memory device 123, or both.

(2) Substrate Processing Process

As a process in a process of manufacturing a semiconductor device, an example of a process of forming a metal film on a substrate will be described with reference to FIGS. 4A and 4B. The process of forming a metal film is executed with use of the processing furnace 202 of the aforementioned substrate processing apparatus 10. In the following description, operations of the respective components constituting the substrate processing apparatus 10 are controlled by the controller 121.

Figure 4A:
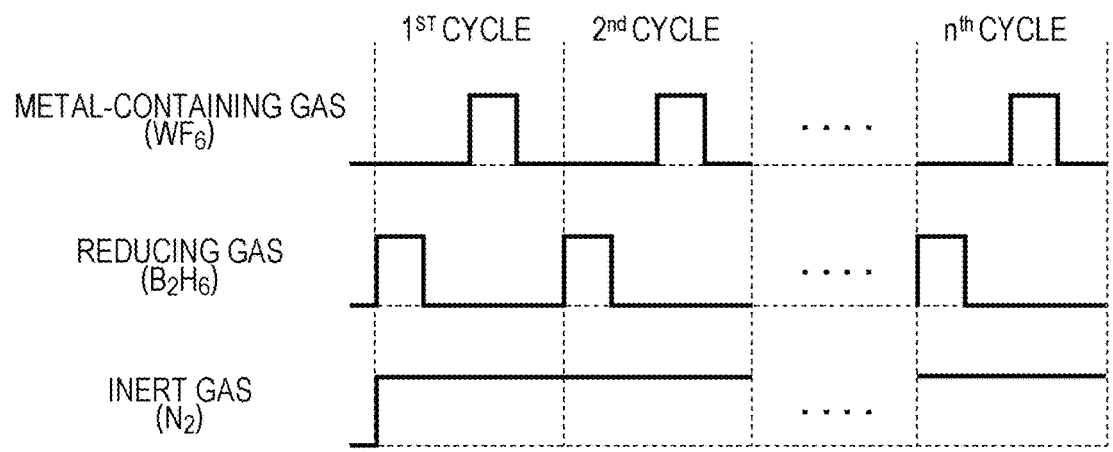
FIG. 4A is a timing chart illustrating a sequence of a W film forming process according to an embodiment of the present invention.
Figure 4B:
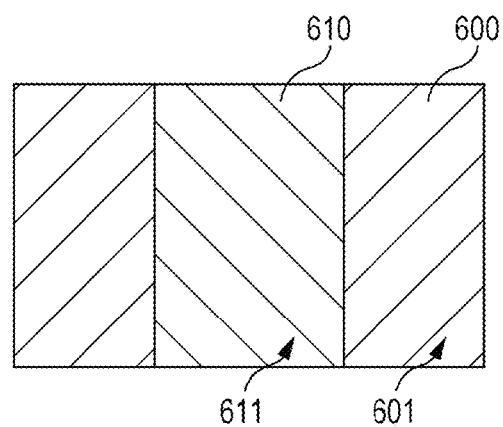
FIG. 4B is a schematic plan view illustrating an initial wafer.

In a film-forming sequence illustrated in FIG. 4A, by performing a predetermined number of times a cycle of performing a step of supplying the wafer 200 serving as a substrate having an insulating surface and a conductive surface with reducing gas such as $B_2H_6$ gas and a step of supplying the wafer 200 with metal-containing gas such as $WF_6$ gas in a time-division manner (asynchronously, intermittently, and in a pulsed manner), a metal film such as a W film is formed selectively on the insulating surface. At this time, the step of supplying $B_2H_6$ gas is performed prior to the step of supplying $WF_6$ gas.

In the present description, "perform a process (a process is alternatively referred to as processing, a cycle, a step, or the like) a predetermined number of times" means performing this process or the like once or plural times. That is, it means performing this process or the like once or more times.

In the present description, "time-division" means temporal separation. For example, in the present description, performing respective processes in a time-division manner means performing respective processes asynchronously (non-simultaneously), that is, performing respective processes non-synchronously (not performing respective processes simultaneously). In other words, it means performing respective processes intermittently (in a pulsed manner) and alternately. That is, it means that processing gas to be supplied in a process is supplied not to be mixed with gas to be supplied in another process. In a case in which respective processes are performed plural times, processing gas to be supplied in one process and processing gas to be supplied in another process are supplied alternately not to be mixed with each other.

Also, in the present description, in a case in which the term "wafer" is used, the wafer may mean "the wafer itself" or "a laminated body (a collective body) of the wafer, and a predetermined layer, a predetermined film, and the like formed on the surface of the wafer," that is, the wafer including a predetermined layer, a predetermined film, and the like formed on the surface thereof. Also, in the present description, in a case in which the phrase "the surface of the wafer" is used, the surface of the wafer may mean "the surface of the wafer itself (exposed surface)" or "the surface of a predetermined layer, a predetermined film, and the like formed on the wafer, that is, the uppermost surface of the wafer as a laminated body."

Accordingly, in the present description, in a case in which "supplying the wafer with predetermined gas" is described, the description may mean "directly supplying the surface of the wafer itself (exposed surface) with predetermined gas" or "supplying a layer, a film, and the like formed on the wafer, that is, the uppermost surface of the wafer as a laminated body, with predetermined gas." Also, in the present description, in a case in which "forming a predetermined layer (or film) on the wafer" may mean "directly forming a predetermined layer (or film) on the surface of the wafer itself (exposed surface)" or "forming a predetermined layer (or film) on a layer, a film, and the like formed on the wafer, that is, the uppermost surface of the wafer as a laminated body."

In the present description, a case in which the term "substrate" is used is similar to a case in which the term "wafer" is used. In this case, "the substrate" in the above description may be substituted for "the wafer."

Also, in the present description, the term "metal film" means a film made of a conductive substance containing a metal atom (containing a metal element) (also referred to simply as a conductive film) and includes an elemental metal film made mainly of a metal atom (a film made of a metal element as a simple substance, that is, a film consisting mainly of a metal element), a conductive metal nitride film, a conductive metal oxide film, a conductive metal oxynitride film, a conductive metal oxycarbide film, a conductive metal composite film, a conductive metal alloy film, a conductive metal silicide film, a conductive metal carbide film, a conductive metal carbonitride film, and the like.

Meanwhile, the W film is a conductive metal film and an elemental metal film. The phrase "the W film (or the W layer) means the film or the layer made of W as a simple substance, that is, the film or the layer consisting mainly of W. Accordingly, the expression "the film (or the layer) made of W as a simple substance" can be replaced with "the film (or the layer) consisting mainly of W."

(Wafer Charge and Boat Load)

Figure 2:
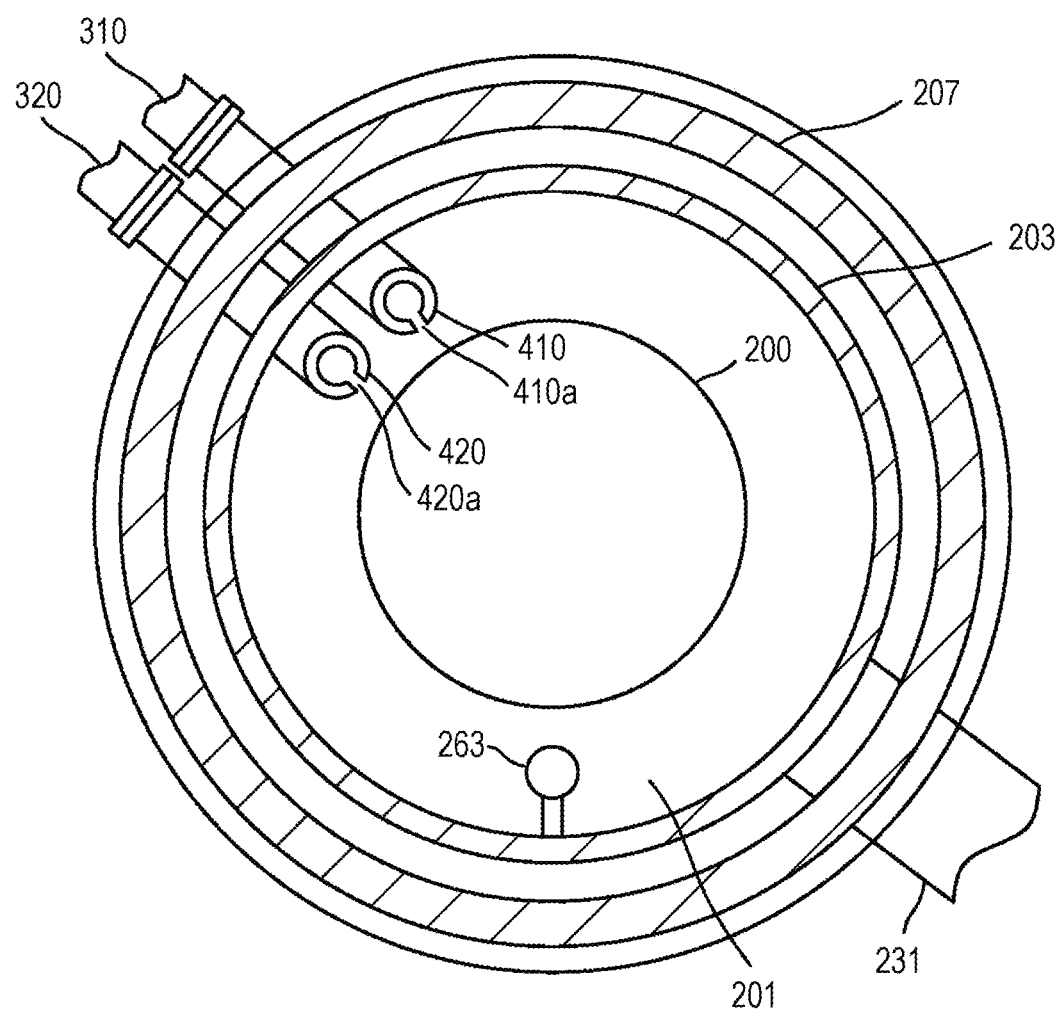
FIG. 2 is a schematic horizontal cross-sectional view along the line A-A in FIG. 1.

When the plurality of wafers 200 are charged on the boat 217 (wafer charge), the boat 217 supporting the plurality of wafers 200 is lifted up by the boat elevator 115 and is loaded into the processing chamber 201 (boat load) as illustrated in FIG. 1. In this state, the seal cap 219 is in a state of closing the lower end opening of the manifold 209 via the O ring 220.

The wafer 200 in a state of being loaded into the processing chamber 201, that is, the wafer 200 before forming thereon a below-mentioned B-containing layer and a below-mentioned W layer, is referred to as "the initial wafer 200." A structure example of the initial wafer 200 will be described with reference to FIG. 4B.

The initial wafer 200 has a structure in which an insulating film 600 and a conductive film 610 are exposed on the surface thereof. That is, the initial wafer 200 has an insulating surface 601 and a conductive surface 611. Such a structure may be formed in any method. An example of the insulating film 600 is a silicon oxide film (SiO film). An example of the conductive film 610 is a metal film, and a specific example thereof is a copper film (Cu film).

(Pressure Regulation and Temperature Adjustment)

The inside of the processing chamber 201 is vacuum-exhausted by the vacuum pump 246 to reach desired pressure (degree of vacuum). At this time, pressure in the processing chamber 201 is measured by the pressure sensor 245, and based on the measured pressure information, the APC valve 243 is subject to feedback control (pressure regulation). The vacuum pump 246 is kept operated at least until processing to the wafer 200 is completed. Also, the wafer 200 in the processing chamber 201 is heated by the heater 207 to reach a desired temperature. At this time, based on the temperature information detected by the temperature sensor 263, the amount of power to be supplied to the heater 207 is subject to feedback control (temperature adjustment) so that the inside of the processing chamber 201 may have a desired temperature distribution. The inside of the processing chamber 201 is kept heated by the heater 207 at least until processing to the wafer 200 is completed. Subsequently, rotation of the boat 217 and the wafer 200 is started by the rotating mechanism 267. The boat 217 and the wafer 200 are kept rotated by the rotating mechanism 267 at least until processing to the wafer 200 is completed.

(W Film Forming Process)

Subsequently, a process of forming a W film on the wafer 200 is executed. The W film forming process includes a $B_2H_6$ gas (reducing gas) supply step, a residual gas removing step, a $WF_6$ gas (metal-containing gas) supply step, and a residual gas removing step described below.

($B_2H_6$ Gas Supply Step)

The valve 324 is opened to cause $B_2H_6$ gas to flow into the gas supply pipe 320. The $B_2H_6$ gas flowing into the gas supply pipe 320 is subject to flow rate control by means of the MFC 322, is supplied into the processing chamber 201 through the gas supply holes 420a of the nozzle 420, and is exhausted from the exhaust pipe 231. At this time, the wafer 200 is supplied with the $B_2H_6$ gas. That is, the surface of the wafer 200 is exposed to the $B_2H_6$ gas. At the same time, the valve 524 is opened to cause $N_2$ gas to flow into the carrier gas supply pipe 520. The $N_2$ gas flowing into the carrier gas supply pipe 520 is subject to flow rate control by means of the MFC 522, is supplied into the processing chamber 201 together with the $B_2H_6$ gas, and is exhausted from the exhaust pipe 231. At this time, to prevent the $B_2H_6$ gas from flowing into the nozzle 410, the valve 514 is opened to cause $N_2$ gas to flow into the carrier gas supply pipe 510. The $N_2$ gas is supplied into the processing chamber 201 via the gas supply pipe 310 and the nozzle 410 and is exhausted from the exhaust pipe 231.

At this time, the APC valve 243 is appropriately adjusted to set the pressure in the processing chamber 201 to pressure in a range from 1 to 1000 Pa, preferably in a range from 10 to 500 Pa, such as 50 Pa. In a case in which the pressure in the processing chamber 201 is lower than 1 Pa, the deposition rate may decrease, and in a case in which the pressure is higher than 1000 Pa, the selectivity may break (the selectivity may not work). The supply flow rate of the $B_2H_6$ gas controlled by the MFC 322 is set to a flow rate in a range from 1 to 15000 sccm, preferably in a range from 6000 to 10000 sccm, such as 8000 sccm. In a case in which the supply flow rate of the $B_2H_6$ gas is less than 1 sccm, the deposition rate may decrease, and the in-plane film thickness uniformity may be degraded, and in a case in which the supply flow rate is more than 15000 sccm, the selectivity may break, and the in-plane film thickness uniformity may be degraded. The supply flow rate of the $N_2$ gas controlled by each of the MFCs 512 and 522 is set to a flow rate in a range from 1 to 10000 sccm, preferably in a range from 1000 to 4000 sccm, such as 2500 sccm. In a case in which the supply flow rate of the $N_2$ gas is less than 1 sccm, the deposition rate may decrease, and the in-plane film thickness uniformity may be degraded, and in a case in which the supply flow rate is more than 10000 sccm, the selectivity may break, and the in-plane film thickness uniformity may be degraded. The time to supply the $B_2H_6$ gas to the wafer 200, that is, the gas supply time (irradiation time), is set to time in a range from 1 to 60 seconds, preferably in a range from 10 to 30 seconds, such as 20 seconds. In a case in which the gas supply time is shorter than 1 second, the deposition rate may decrease, and the in-plane film thickness uniformity may be degraded, and in a case in which the gas supply time is longer than 60 seconds, the selectivity may break, and the in-plane film thickness uniformity may be degraded. At this time, the temperature of the heater 207 is set to a temperature which causes the temperature of the wafer 200 to be a temperature in a range from 150 to 300° C., preferably in a range from 160 to 200° C., such as 175° C. In a case in which the temperature of the wafer 200 is lower than 150° C., the reaction between the $B_2H_6$ gas and the insulating film 600 of the wafer 200 may be difficult, and in a case in which the temperature of the wafer 200 is higher than 300° C., the selectivity may break.

By supplying the $B_2H_6$ gas, the B-containing layer is formed selectively on the insulating film 600 (on the insulating surface 601) of the wafer 200. In the present description, "forming a film (a layer) selectively" means substantially forming a film (a layer) only on a foundation having specific composition and not substantially forming the film (the layer) on a foundation having other composition. That is, in the present description, it means substantially forming the B-containing layer only on the insulating film 600 (on the insulating surface 601) of the wafer 200 and not substantially forming the B-containing layer on the conductive film 610 (on the conductive surface 611). Here, "substantially forming/not substantially forming" includes a case in which a small amount of B-containing layer is unintentionally formed on the conductive film 610 and a case in which the B-containing layer is easier to be formed on the insulating film 600 and is more difficult to be formed on the conductive film 610. That is, the B-containing layer is not formed or is difficult to be formed on the conductive film 610 (on the conductive surface 611) on the wafer 200 and is easier to be formed on the insulating film 600 (on the insulating surface 601) on the wafer 200. As will be described below in the below-mentioned example, the W film is formed selectively on the insulating film 600. By taking this into consideration, it is estimated that the B-containing layer is formed selectively (preferentially) on the insulating surface 601 of the wafer 200 as in the example. The B-containing layer is a collective term including a continuous or discontinuous layer made of B, a continuous or discontinuous layer made of B and containing H (B layer containing H), and a B thin film containing H made by laminating these. The continuous layer made of B and containing H may be referred to as a B thin film containing H. The B constituting the B-containing layer containing H includes not only one whose bond with H is not completely released but also one whose bond with H is completely released.

(Residual Gas Removing Step)

After the B-containing layer is formed, the valve 324 is closed to stop supply of the $B_2H_6$ gas. At this time, the APC valve 243 is kept opened to vacuum-exhaust the inside of the processing chamber 201 by means of the vacuum pump 246 to remove unreacted $B_2H_6$ gas and $B_2H_6$ gas which has contributed to formation of the B-containing layer remaining in the processing chamber 201 out of the processing chamber 201. That is, unreacted $B_2H_6$ gas and $B_2H_6$ gas which has contributed to formation of the B-containing layer remaining in a space in which the wafer 200, on which the B-containing layer has been formed, exists. At this time, the valves 514 and 524 are kept opened to keep supply of the $N_2$ gas into the processing chamber 201. The $N_2$ gas acts as purge gas and can enhance an effect of removing unreacted $B_2H_6$ gas and $B_2H_6$ gas which has contributed to formation of the B-containing layer remaining in the processing chamber 201 out of the processing chamber 201.

At this time, it is not necessary to completely remove gas remaining in the processing chamber 201 and to completely purge the inside of the processing chamber 201. A small amount of gas may remain in the processing chamber 201 as long as the gas does not have an adverse effect on the subsequent steps. Also, the flow rate of the $N_2$ gas to be supplied into the processing chamber 201 does not need to be high. For example, by supplying as much $N_2$ gas as the volume of the reaction tube 203 (processing chamber 201), the purge can be performed to the extent of not having an adverse effect on the subsequent steps. In this manner, since the inside of the processing chamber 201 is not completely purged, the purge time can be shortened, and the throughput can be improved. Also, consumption of the $N_2$ gas can be restricted to the minimum necessary.

($WF_6$ Gas Supply Step)

The valve 314 is opened to cause $WF_6$ gas to flow into the gas supply pipe 310. The $WF_6$ gas flowing into the gas supply pipe 310 is subject to flow rate control by means of the MFC 312, is supplied into the processing chamber 201 through the gas supply holes 410a of the nozzle 410, and is exhausted from the exhaust pipe 231. At this time, the wafer 200 is supplied with the $WF_6$ gas. That is, the surface of the wafer 200 is exposed to the $WF_6$ gas. At the same time, the valve 514 is opened to cause $N_2$ gas to flow into the carrier gas supply pipe 510. The $N_2$ gas flowing into the carrier gas supply pipe 510 is subject to flow rate control by means of the MFC 512, is supplied into the processing chamber 201 together with the $WF_6$ gas, and is exhausted from the exhaust pipe 231. At this time, to prevent the $WF_6$ gas from flowing into the nozzle 420, the valve 524 is opened to cause $N_2$ gas to flow into the carrier gas supply pipe 520. The $N_2$ gas is supplied into the processing chamber 201 via the gas supply pipe 320 and the nozzle 420 and is exhausted from the exhaust pipe 231.

At this time, the APC valve 243 is appropriately adjusted to set the pressure in the processing chamber 201 to pressure in a range from 1 to 1000 Pa, preferably in a range from 10 to 500 Pa, such as 50 Pa. In a case in which the pressure in the processing chamber 201 is lower than 1 Pa, the deposition rate may decrease, and the in-plane film thickness uniformity may be degraded, and in a case in which the pressure is higher than 1000 Pa, the selectivity may break (the selectivity may not work), and the in-plane film thickness uniformity may be degraded. The supply flow rate of the $WF_6$ gas controlled by the MFC 312 is set to a flow rate in a range from 1 to 1000 sccm, preferably in a range from 100 to 500 sccm, such as 300 sccm. In a case in which the supply flow rate of the $WF_6$ gas is less than 1 sccm, the deposition rate may decrease, and the in-plane film thickness uniformity may be degraded, and in a case in which the supply flow rate is more than 1000 sccm, the selectivity may break, and the in-plane film thickness uniformity may be degraded. The supply flow rate of the $N_2$ gas controlled by each of the MFCs 512 and 522 is set to a flow rate in a range from 1 to 10000 sccm, preferably in a range from 1000 to 5000 sccm, such as 3500 sccm. In a case in which the supply flow rate of the $N_2$ gas is less than 1 sccm, the deposition rate may decrease, and the in-plane film thickness uniformity may be degraded, and in a case in which the supply flow rate is more than 10000 sccm, the selectivity may break, and the in-plane film thickness uniformity may be degraded. The time to supply the $WF_6$ gas to the wafer 200, that is, the gas supply time (irradiation time), is set to time in a range from 1 to 60 seconds, preferably in a range from 10 to 30 seconds, such as 20 seconds. In a case in which the gas supply time is shorter than 1 second, the deposition rate may decrease, and the in-plane film thickness uniformity may be degraded, and in a case in which the gas supply time is longer than 60 seconds, the selectivity may break, and the in-plane film thickness uniformity may be degraded. At this time, the temperature of the heater 207 is set to a similar temperature to that in the $B_2H_6$ gas supply step, for example.

By supplying the $WF_6$ gas, the B-containing layer formed on the insulating film 600 (on the insulating surface 601) of the wafer 200 and the $WF_6$ gas react with each other, and the W layer is formed selectively (preferentially) on the upper side of the insulating film 600 (on the upper side of the insulating surface 601) of the wafer 200. That is, the W layer is not formed or is difficult to be formed on a region other than the B-containing layer and is easier to be formed on the B-containing layer.

The W layer is formed to have a thickness ranging from less than one atomic layer to about several atomic layers, for example. The W layer may be a layer constituted by W as a simple substance having a thickness ranging from less than one atomic layer to about several atomic layers, that is, a layer consisting mainly of W, an adsorption layer of $WF_6$ gas, a W-containing layer containing at least any of B, H, and F, or a layer containing some of these.

The adsorption layer of $WF_6$ gas includes a continuous or discontinuous adsorption layer of gas molecules of the $WF_6$ gas. That is, the adsorption layer of $WF_6$ gas includes an adsorption layer having a thickness of one molecular layer or less than one molecular layer constituted by $WF_6$ molecules. The $WF_6$ molecules constituting the adsorption layer of $WF_6$ gas include ones in which bond between W and F is partially released. That is, the adsorption layer of $WF_6$ gas may be a physical adsorption layer of $WF_6$ gas, a chemical adsorption layer of $WF_6$ gas, or both.

The W-containing layer containing F is a collective term including a continuous or discontinuous layer made of W and containing F (W layer containing F) and a W thin film containing F made by laminating these. The continuous layer made of W and containing F may be referred to as a W thin film containing F. The W constituting the W-containing layer containing F includes not only one whose bond with F is not completely released but also one whose bond with F is completely released.

In a case in which the B-containing layer contains H, a gaseous substance containing at least any of B, H, and F (a reaction by-product such as hydrogen fluoride (HF)) is formed in a reaction procedure between the B-containing layer and the $WF_6$ gas at the time of forming the W layer and is exhausted through the exhaust pipe 231 out of the processing chamber 201.

(Residual Gas Removing Step)

After the W-containing layer is formed, the valve 314 is closed to stop supply of the $WF_6$ gas. At this time, the APC valve 243 is kept opened to vacuum-exhaust the inside of the processing chamber 201 by means of the vacuum pump 246 to remove unreacted $WF_6$ gas and $WF_6$ gas which has contributed to formation of the W layer remaining in the processing chamber 201 out of the processing chamber 201. That is, unreacted $WF_6$ gas and $WF_6$ gas which has contributed to formation of the W layer remaining in a space in which the wafer 200, on which the W layer has been formed, exists. At this time, the valves 514 and 524 are kept opened to keep supply of the $N_2$ gas into the processing chamber 201. The $N_2$ gas acts as purge gas and can enhance an effect of removing unreacted $WF_6$ gas and $WF_6$ gas which has contributed to formation of the W layer remaining in the processing chamber 201 out of the processing chamber 201. At this time, in a case in which a by-product is generated in the processing chamber 201 along with formation of the W layer, the by-product is also removed from the processing chamber 201.

At this time, in a similar manner to that in the residual gas removing step after the $B_2H_6$ gas supply step, it is not necessary to completely remove gas remaining in the processing chamber 201 and to completely purge the inside of the processing chamber 201.

(Performing Predetermined Number of Times)

By performing once or more times (a predetermined number of times) a cycle of performing the aforementioned $B_2H_6$ gas supply step, residual gas removing step, $WF_6$ gas supply step, and residual gas removing step sequentially in a time-division manner (asynchronously, intermittently, and in a pulsed manner), the W film having a predetermined thickness can be formed on the wafer 200. The aforementioned cycle is preferably performed plural times. By performing the cycle a predetermined number of times, the W film can be formed selectively (preferentially) on the insulating film 600 of the wafer 200. That is, the W film can be formed selectively on the insulating surface 601 of the wafer 200 directly.

As will be described in the below example, selective formation of the W film on the insulating film 600 seems to be performed during incubation time, which is time required until growth of the W film on the conductive film 610 is started. Accordingly, to improve a selection ratio for the selective formation of the W film on the insulating film 600, the predetermined number of times for performing the aforementioned cycle in the process of forming the W film is preferably selected so that the total processing time may be less than the incubation time for the growth of the W film on the conductive film 610.

Also, to improve the selection ratio for the selective formation of the W film on the insulating film 600, the incubation time for the growth of the W film on the conductive film 610 is preferably long.

(Heat Treatment Process)

Subsequently, the W film formed on the wafer 200 is heat-treated. In this process, the amount of power to be supplied to the heater 207 is adjusted so that the temperature of the wafer 200 may be 600° C. or higher such as 800 to 850° C. to heat-treat (anneal) the W film. The annealing is performed under an inert gas atmosphere such as $N_2$ gas. The treatment time for the annealing is set to predetermined time in a range from 1 to 120 seconds, for example. By performing the annealing, a crystal state of the W film formed on the foundation film on the surface of the wafer 200 can be a desired crystal state and can be stabilized. Also, impurities remaining in the W film can be desorbed. That is, the annealing enables the W film to be modified. In addition, the annealing also enables the W film to be densified.

Meanwhile, although an example in which the W film forming process and the heat treatment process are performed in the same processing chamber 201 (in-situ) is described in the present embodiment, the W film forming process and the heat treatment process may be performed in different processing chambers, respectively (ex-situ). In a case in which both the processes are performed in-situ, processes can consistently be performed with the wafer 200 kept under vacuum without exposing the wafer 200 to the atmosphere in the middle of the processes, and the stable film-forming processing can be performed. In a case in which both the processes are performed ex-situ, the temperatures in the respective processing chambers can be preset to or close to processing temperatures for the respective processes, for example. Time required for temperature adjustment can be shortened, which enables production efficiency to be improved. Alternatively, the heat treatment process may not be performed. In this case, after performing once or more times (a predetermined number of times) the cycle of performing the aforementioned $B_2H_6$ gas supply step, residual gas removing step, $WF_6$ gas supply step, and residual gas removing step sequentially in a time-division manner (asynchronously, intermittently, and in a pulsed manner), purge and atmospheric pressure recovery described below are performed.

(Purge and Atmospheric Pressure Recovery)

When the annealing of the wafer 200 is finished, the valves 514 and 524 are kept opened, and $N_2$ gas is supplied into the processing chamber 201 from the respective carrier gas supply pipes 510 and 520 and is exhausted from the exhaust pipe 231. The $N_2$ gas acts as purge gas. Thus, the inside of the processing chamber 201 is purged by inert gas, and gas and by-product remaining in the processing chamber 201 are removed out of the processing chamber 201 (purge). Subsequently, the atmosphere in the processing chamber 201 is substituted with inert gas (inert gas substitution), and the pressure in the processing chamber 201 is recovered to normal pressure (atmospheric pressure recovery).

(Boat Unload and Wafer Discharge)

The seal cap 219 is lowered by the boat elevator 115, and the lower end of the manifold 209 is opened. The processed wafer 200 is unloaded out of the processing chamber 201 from the lower end of the manifold 209 in a state of being supported by the boat 217 (boat unload). The processed wafer 200 is taken out from the boat 217 (wafer discharge).

(3) Effect of Present Embodiment

According to the present embodiment, one or a plurality of effects described below can be obtained.

According to the present embodiment, by performing a predetermined number of times the cycle of performing the step of supplying $B_2H_6$ gas to the wafer 200 having the insulating surface 601 and the conductive surface 611 and the step of supplying $WF_6$ gas to the wafer 200 in a time-division manner (asynchronously, intermittently, and in a pulsed manner), the W film can be formed (grow) selectively on the insulating surface.

It is known that causing the W film to grow selectively on the conductive surface without causing the W film to grow on the insulating surface is relatively easy. However, conventionally, the W film cannot grow selectively on the insulating surface without causing the W film to grow on the conductive surface. According to the present embodiment, the W film can grow selectively on the insulating surface, that is, the W film can grow in a reverse selection manner.

Other Embodiments

The present invention is not limited to the above embodiment and can be altered in various ways without departing from the scope of the present invention. For example, the following embodiments are available based on consideration and the like in the below-mentioned example. Processing conditions in the following other embodiments can be similar to those in the above embodiment, for example. The processing conditions may be other processing conditions as needed.

In the above embodiment, although the $B_2H_6$ gas has been illustrated as reducing gas, the reducing gas is not limited to the $B_2H_6$ gas. As the reducing gas, B-containing gas can preferably be used, and inorganic borane-based gas such as triborane ($B_3H_8$) gas can be used instead of the $B_2H_6$ gas.

In the above embodiment, although the $WF_6$ gas has been illustrated as metal-containing gas serving as a material gas for the W film, the metal-containing gas serving as a material gas for the W film is not limited to the $WF_6$ gas. As the metal-containing gas serving as a material gas for the W film, other halogenated tungsten gas such as tungsten hexachloride ($WCl_6$) gas, or the like, can be used instead of the $WF_6$ gas.

In the above embodiment, the W film has been illustrated as a metal film which is to be formed selectively on the insulating surface on the wafer. However, as the metal film which is to be formed selectively on the insulating surface on the wafer, a titanium (Ti) film, a tantalum (Ta) film, a molybdenum (Mo) film, a zinc (Zn) film, a ruthenium (Ru) film, and an aluminum (Al) film may be formed instead of the W film, for example. As the material gas used in a case of forming such a metal film, metal-containing gas which is to be reduced by reducing gas such as B-containing gas, such as metal halide gas, can be used. Specific examples of the metal-containing gas serving as a material gas for the metal film which can be used are titanium tetrafluoride ($TiF_4$) gas, titanium tetrachloride ($TiCl_4$) gas, tantalum pentafluoride ($TaF_5$) gas, tantalum pentachloride ($TaCl_3$) gas, molybdenum pentafluoride ($MoF_5$) gas, molybdenum pentachloride ($MoCl_3$) gas, zinc difluoride ($ZnF_2$) gas, zinc dichloride ($ZnCl_2$) gas, ruthenium trifluoride ($RuF_3$) gas, ruthenium trichloride ($RuCl_3$), aluminum trifluoride ($AlF_3$), aluminum trichloride ($AlCl_3$), and trimethyl aluminum (($CH_3$)$_3$Al, abbreviation: TMA).

In the above embodiment, although SiO has been illustrated as a material for the insulating film exposed on the surface of the wafer, that is, a material constituting the insulating surface serving as a foundation on which the metal film is formed selectively, the material constituting the insulating surface is not limited to the SiO. As the material constituting the insulating surface, one containing an element having an unshared electron pair such as O and N can preferably be used. Examples of such a material are silicon nitride (SiN) and silicon oxynitride (SiON) as well as SiO (as for more detailed description, refer to the below-mentioned example).

In the above embodiment, although Cu has been illustrated as a material for the conductive film exposed on the surface of the wafer, that is, a material constituting the conductive surface on which the metal film is not formed, the material constituting the conductive surface is not limited to the Cu. As the material constituting the conductive surface, various metal materials (conductive materials each containing a metal element) can be used. Examples of such a material are aluminum (Al), titanium (Ti), titanium nitride (TiN), tantalum (Ta), and tantalum nitride (TaN) as well as Cu (as for more detailed description, refer to the below-mentioned example).

The aforementioned embodiment, respective modification examples, respective application examples, and the like can be used in combination as appropriate. Also, processing conditions in each of these cases can be similar to those in the above embodiment, for example.

The process recipe (a program describing processing procedures, processing conditions, and the like) for use in forming various kinds of thin films is preferably prepared individually (a plurality of process recipes are preferably prepared) in accordance with the content of the substrate processing (a kind, a composition ratio, a quality, and a thickness of a thin film to be formed, processing procedures, processing conditions, and the like). When substrate processing is started, an appropriate process recipe is preferably selected as appropriate from the plurality of process recipes in accordance with the content of the substrate processing. Specifically, the plurality of process recipes prepared individually corresponding to the contents of the substrate processing are preferably stored (installed) in the memory device 121c included in the substrate processing apparatus via a telecommunication line or a recording medium (external memory device 123) having recorded therein the process recipes. When the substrate processing is started, the CPU 121a included in the substrate processing apparatus preferably selects an appropriate process recipe as appropriate from the plurality of process recipes stored in the memory device 121c in accordance with the content of the substrate processing. Such a configuration enables thin films having various kinds, composition ratios, qualities, and thicknesses to be formed by one substrate processing apparatus for general purposes reproducibly. Also, the operation burden of an operator (such as a burden of input of processing procedures, processing conditions, and the like) can be reduced, and the operator can start the substrate processing promptly while avoiding operation errors.

The aforementioned process recipe can be achieved not only by preparing a new process recipe but also by changing an existing process recipe for an existing substrate processing apparatus. In a case of changing a process recipe, the process recipe according to the present invention can be installed in the existing substrate processing apparatus via a telecommunication line or a recording medium having recorded therein the process recipe, or the existing process recipe itself can be changed to the process recipe according to the present invention by operating an input/output device of the existing substrate processing apparatus.

In the above embodiment, an example of forming a film with use of a processing furnace having a structure in which a nozzle supplying processing gas is provided to erect in one reaction tube and in which an exhaust port is provided at a lower portion of the reaction tube in a substrate processing apparatus which is a batch-type vertical apparatus for processing a plurality of substrates at a time has been described. However, the present invention can be applied to a case of forming a film with use of a processing furnace having another structure. For example, the present invention can be applied to a case of forming a film with use of a processing furnace having a structure in which two reaction tubes each having a concentric cross-section (an outside reaction tube is referred to as an outer tube while an inside reaction tube is referred to as an inner tube) are provided, and processing gas flows from a nozzle provided to erect in the inner tube to an exhaust port opened at a position of a sidewall of the outer tube opposed to the nozzle with substrates interposed between the sidewall of the outer tube and the nozzle (at a line-symmetric position). Also, processing gas may be supplied from a gas supply port opened on a sidewall of the inner tube instead of the nozzle provided to erect in the inner tube. At this time, the exhaust port opened on the outer tube may be opened in accordance with the height of the plurality of substrates laminated and housed in the processing chamber. Also, the exhaust port may be formed in a hole shape or a slit shape.

In the above embodiment, although an example of forming a film with use of a substrate processing apparatus which is a batch-type vertical apparatus for processing a plurality of substrates at a time has been described, the present invention is not limited to this and can suitably be applied to a case of forming a film with use of a single-substrate processing apparatus for processing one or several substrates at a time. Also, in the above embodiment, although an example of forming a thin film with use of a substrate processing apparatus having a hot-wall-type processing furnace has been described, the present invention is not limited to this and can suitably be applied to a case of forming a thin film with use of a substrate processing apparatus having a cold-wall-type processing furnace. In these cases as well, processing conditions can be similar to those in the above embodiment, for example.

Figure 10:
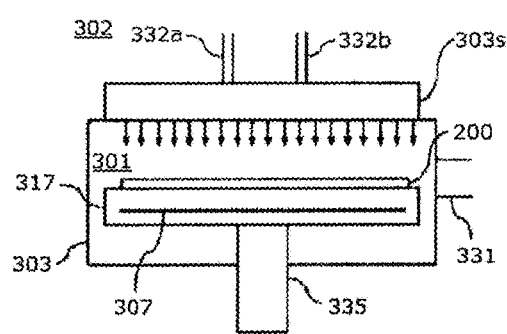
FIGS. 10(a) and 10(b) are schematic views illustrating a configuration of a processing furnace of a substrate processing apparatus used in another embodiment of the present disclosure respectively, in which the processing furnace portion is illustrated as a longitudinal sectional view.
Figure 10:
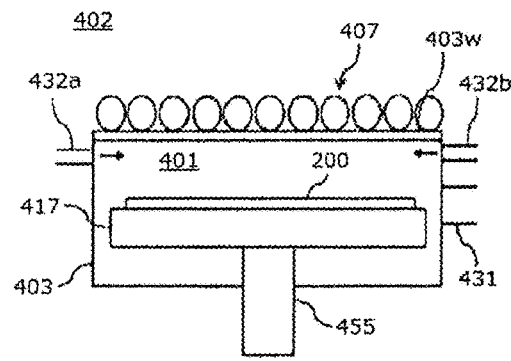

For example, the present disclosure may be appropriately applicable to a case in which a film is formed using a substrate processing apparatus having a processing furnace 302 shown in FIG. 10(*a*). The processing furnace 302 includes a process vessel 303 forming a process chamber 301, a shower head 303*s* supplying a gas in the form of a shower into the process chamber 301, a support table 317 configured to support one or several wafers 200 in a horizontal posture, a rotation shaft 355 configured to support the support table 317 from a bottom end of the support table 317, and a heater 307 installed in the support table 317. An inlet (gas introduction port) of the shower head 303*s* is connected with a gas supply port 332*a* for supplying the above-described precursor gas and a gas supply port 332*b* for supplying the above-described reaction gas. The gas supply port 332*a* is connected with a precursor gas supply system like the precursor gas supply system in the above-described embodiment. The gas supply port 332*b* is connected with a reaction gas supply system like the reaction gas supply system in the above-described embodiment. A gas distribution plate for supplying a gas in the form of a shower into the process chamber 301 is installed in an outlet (gas discharging port) of the shower head 303*s*. An exhaust port 331 for exhausting the interior of the process chamber 301 is installed in the process vessel 303. The exhaust port 331 is connected with an exhaust system like the exhaust system in the above-described embodiment.

In addition, for example, the present disclosure may be appropriately applicable to a case in which a film is formed using a substrate processing apparatus having a processing furnace 402 shown in FIG. 10(*b*). The processing furnace 402 includes a process vessel 403 forming a process chamber 401, a support table 417 configured to support one or several wafers 200 in a horizontal posture, a rotation shaft 455 configured to support the support table 417 from a bottom end of the support table 417, a lamp heater 407 configured to irradiate light toward the wafers 200 in the process vessel 403, and a quartz window 403*w* allowing the light irradiated from the lamp heater 407 to transmit there through. The process vessel 403 is connected with a gas supply port 432*a* for supplying the above-described precursor gas and a gas supply port 432*b* for supplying the above-described reaction gas. The gas supply port 432*a* is connected with a precursor gas supply system like the precursor gas supply system in the above-described embodiment. The gas supply port 432*b* is connected with a reaction gas supply system like the reaction gas supply system in the above-described embodiment. An exhaust port 431 for exhausting the interior of the process chamber 401 is installed in the process vessel 403. The exhaust port 431 is connected with an exhaust system like the exhaust system in the above-described embodiment.

Even when these substrate processing apparatuses are used, a film forming process can be performed with the same sequence and process conditions as the above-described embodiments and modifications.

EXAMPLE

First, an experiment of forming a W film on a wafer having an insulating surface and a conductive surface will be described.

Figure 5A:
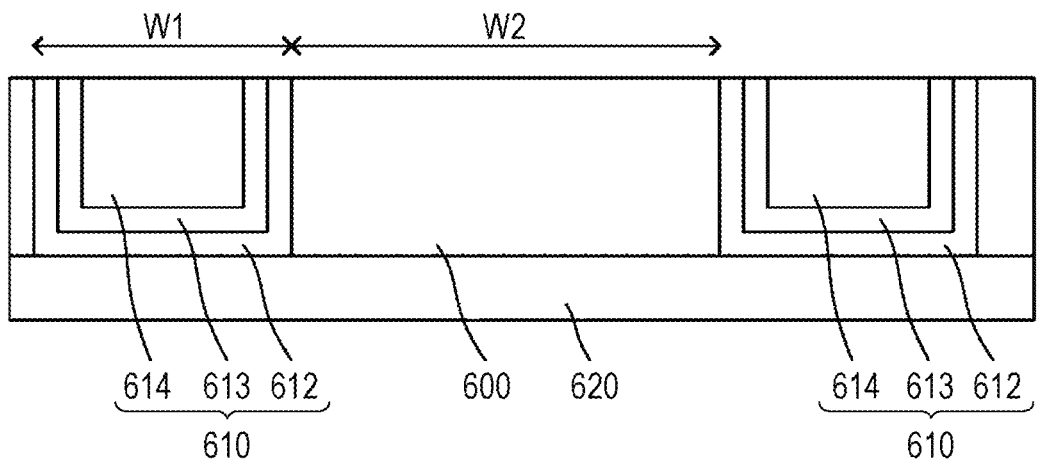
FIGS. 5A and 5B are a schematic cross-sectional view and a schematic plan view of a wafer in an example, respectively.
Figure 5B:
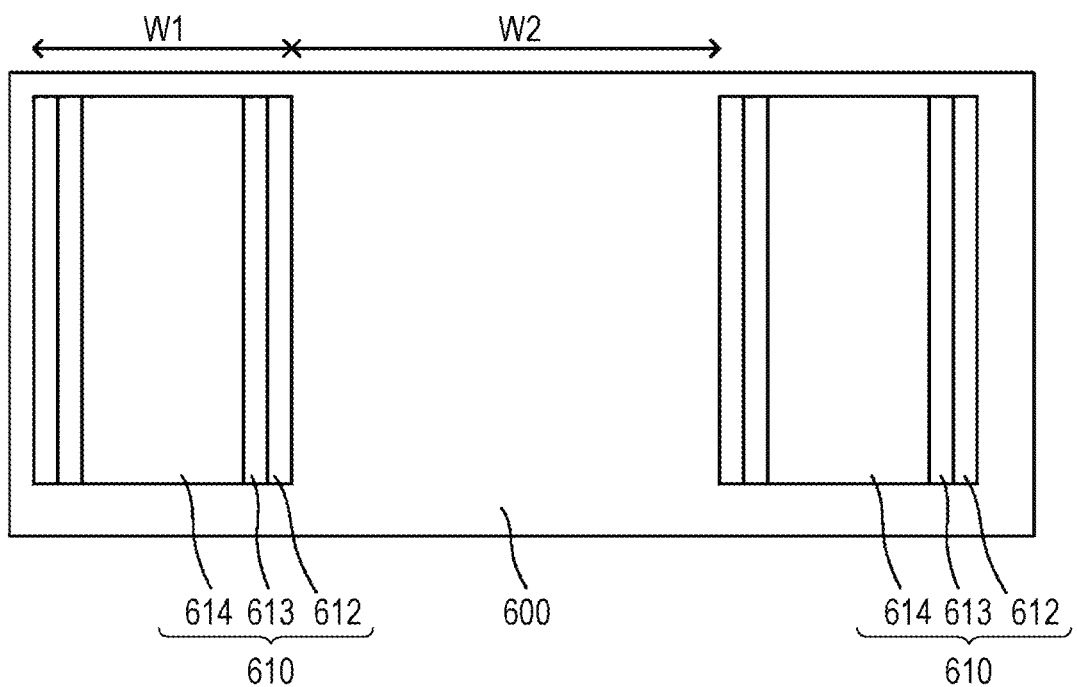

Referring to FIGS. 5A and 5B, a schematic structure of a test wafer having formed thereon a W film will be described. The test wafer includes a base material 620, and the insulating film 600 and the conductive film 610 formed on the base material 620 in a line-and-space (L/S) pattern. The base material 620 is made of silicon, and the insulating film 600 is made of SiO. The conductive film 610 is formed in a groove formed in the insulating film 600. The conductive film 610 includes a Ta film 612 covering the inner surface of the groove, a TaN film 613 formed on the Ta film 612, and a Cu film 614 filled on the TaN film 613. The conductive film 610 is tens to hundreds of nm in width and several mm in length, for example.

A width W1 of the conductive film 610 was varied in a range from 100 to 150 nm, and a width W2 of the insulating film 600 was varied in a range from 100 to 450 nm, to form various L/S patterns.

By performing the film-forming sequence illustrated in FIG. 4A, that is, the cycle of performing the $B_2H_6$ gas supply step, residual gas removing step, $WF_6$ gas supply step, and residual gas removing step sequentially in a time-division manner, 100 times, for example, the W film was formed on the test wafer. The pressure in the film formation was set to a value in a range from 50 to 1000 Pa, for example, the $B_2H_6$ gas supply flow rate was set to a value in a range from 30 to 50 sccm, for example, and the $WF_6$ gas supply flow rate was set to a value in a range from 3 to 7 sccm, for example. In the experiment, the $B_2H_6$ gas was diluted by $H_2$ gas. The $B_2H_6$ gas supply time, the residual gas removing time, the $WF_6$ gas supply time, and the residual gas removing time per cycle were set to 5, 5, 2, and 5 seconds, respectively, for example.

Figure 6:
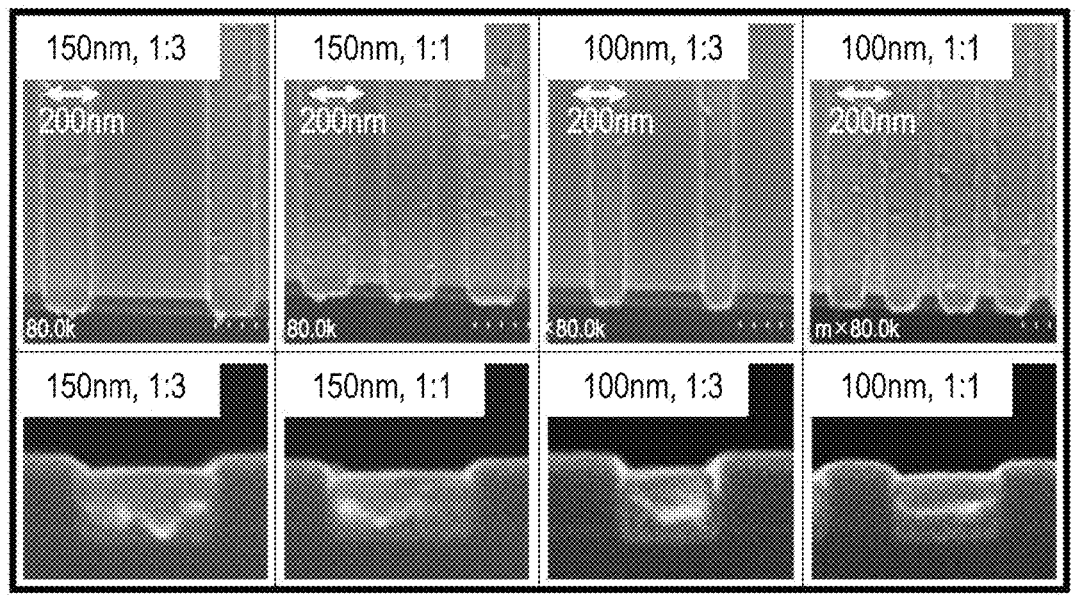
FIG. 6 illustrates SEM photos of samples of various L/S patterns prepared in the example.

FIG. 6 illustrates scanning electron microscope (SEM) photos of results of forming the W film on the wafer having each of various L/S patterns. FIG. 6 illustrates results of four samples of a pattern in which the width of the conductive film was set to 150 nm and in which the width of the insulating film was set to 450 nm, which was three times as long as the width of the conductive film (150 nm, 1:3), a pattern in which the width of the conductive film was set to 150 nm and in which the width of the insulating film was set to 150 nm, which was equal to the width of the conductive film (150 nm, 1:1), a pattern in which the width of the conductive film was set to 100 nm and in which the width of the insulating film was set to 300 nm, which was three times as long as the width of the conductive film (100 nm, 1:3), and a pattern in which the width of the conductive film was set to 100 nm and in which the width of the insulating film was set to 100 nm, which was equal to the width of the conductive film (100 nm, 1:1) in this order from the left side. On the upper side and the lower side of FIG. 6, photos of plan views and photos of cross-sectional views of the respective samples are illustrated, respectively. In any of the L/S pattern samples, the W film was formed selectively on the insulating film successfully without being formed on the conductive film. That is, the W film grew in a reverse selection manner.

Figure 7:
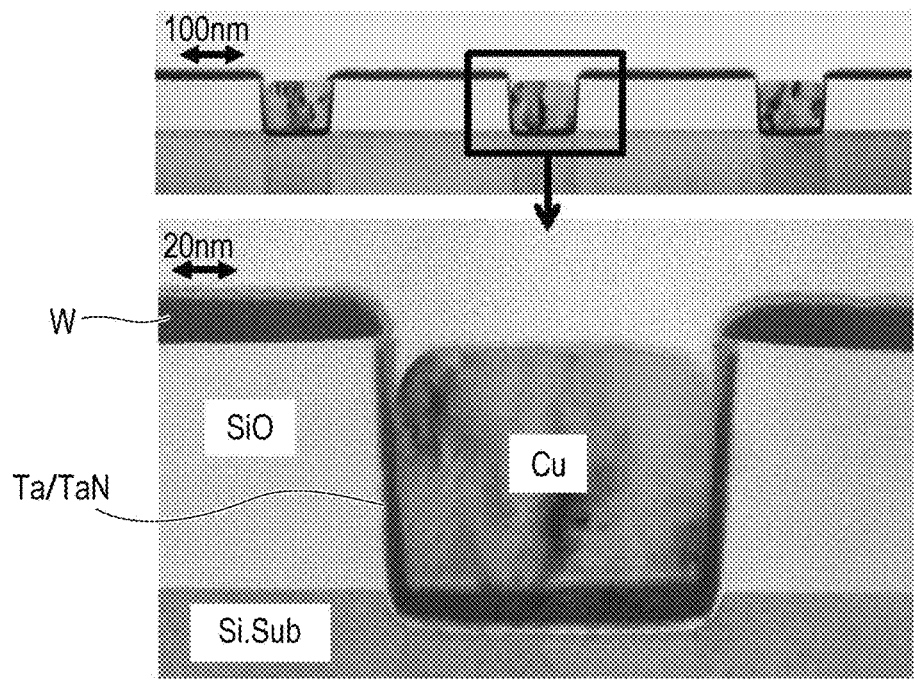
FIG. 7 illustrates TEM photos of a sample prepared in the example.

FIG. 7 illustrates transmission electron microscope (TEM) photos of the cross-sectional view of the sample having the pattern in which the width of the conductive film is 100 nm and in which the width of the insulating film is 300 nm (100 nm, 1:3). On the lower side of FIG. 7, a photo into which a photo on the upper side has been enlarged is illustrated. As is apparent from FIG. 7, the W film is formed selectively on the insulating film (SiO film) without being formed on the conductive film (Cu film). In energy dispersive X-ray spectrometry (EDX) performed at the time of the TEM observation, it was also confirmed that the W film was formed selectively on the SiO film.

Figure 8:
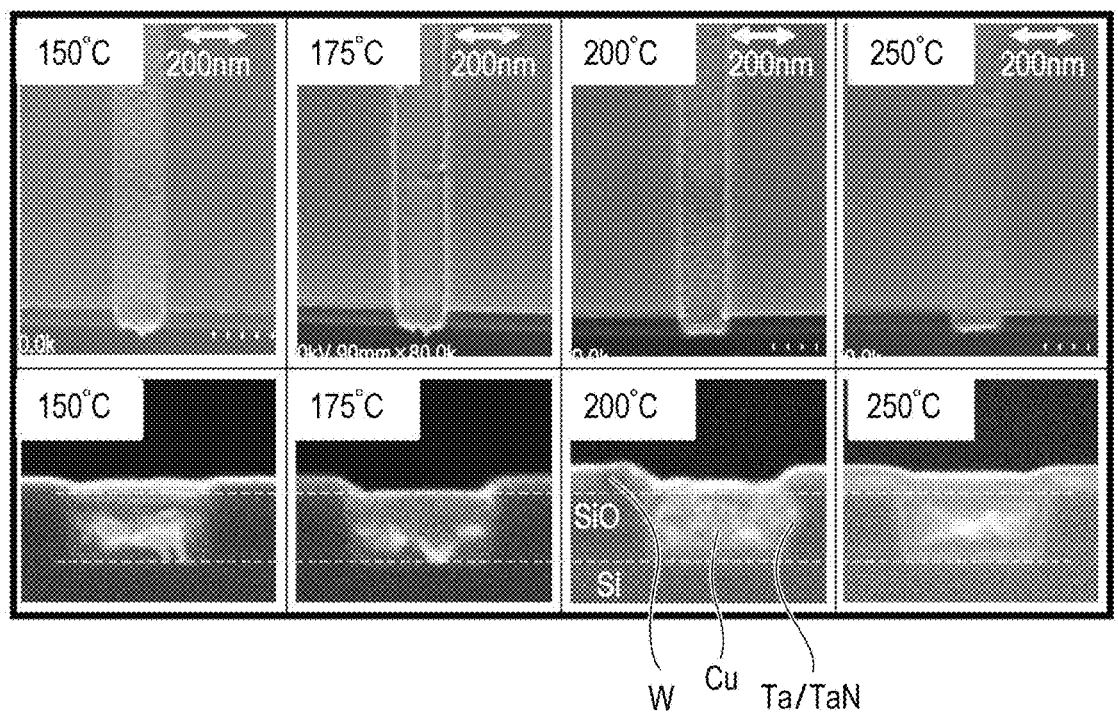
FIG. 8 illustrates SEM photos of samples prepared at various film-forming temperatures in the example.

FIG. 8 illustrates SEM photos of results of forming the W film at various film-forming temperatures. FIG. 8 illustrates results of four samples in which the film-forming temperature was set to 150, 175, 200, and 250° C. in this order from the left side. In the sample in which the film-forming temperature was 150° C., the W film was not formed either on the conductive film (Cu film) or on the insulating film (SiO film). The reason for this is that, at 150° C., heat may have been insufficient to cause a reaction between the B-containing layer and the $WF_6$. As the film-forming temperature was raised, the W film was formed on the insulating film more. In the sample in which the film-forming temperature was 175° C., the W film was formed on the insulating film at the highest selection ratio. However, it was found that, along with a further increase of the film-forming temperature, the W film was formed on the conductive film as well, and the thickness of the W film on the conductive film was increased. In this manner, it was found that growth of the W film on the wafer having the insulating surface and the conductive surface had temperature dependency.

It is estimated from the above results that selective formation of the W film on the insulating film is performed during incubation time, which is time required until growth of the W film on the conductive film is started. That is, it is estimated that the W film is formed selectively on the insulating film by growth of the W film on the insulating film before start of growth of the W film on the conductive film. However, it is estimated that the selection ratio is lowered further as the film-forming temperature is higher since the incubation time before the start of the growth of the W film on the conductive film decreases along with the increase of the film-forming temperature.

Next, an experiment for investigating the incubation time before the start of the growth of the W film on the conductive film will be described.

In this experiment, a TiN film was formed as a conductive film, and the W film was formed on the TiN film. By performing the film-forming sequence illustrated in FIG. 4A, that is, the cycle of performing the $B_2H_6$ gas supply step, residual gas removing step, $WF_6$ gas supply step, and residual gas removing step sequentially in a time-division manner, 100 times, for example, the W film was formed on the TiN film. The $B_2H_6$ gas supply flow rate was set to a value in a range from 30 to 50 sccm, for example, and the $WF_6$ gas supply flow rate was set to a value in a range from 3 to 7 sccm, for example. In the experiment, the $B_2H_6$ gas was diluted by $H_2$ gas. The $WF_6$ gas supply time per cycle was set to 2 seconds, for example.

The film-forming temperature, the film-forming pressure, and the $B_2H_6$ gas supply time per cycle were varied to derive incubation time required until the growth of the W film on the TiN film was started. The incubation time can be expressed in units of cycle.

Figure 9A:
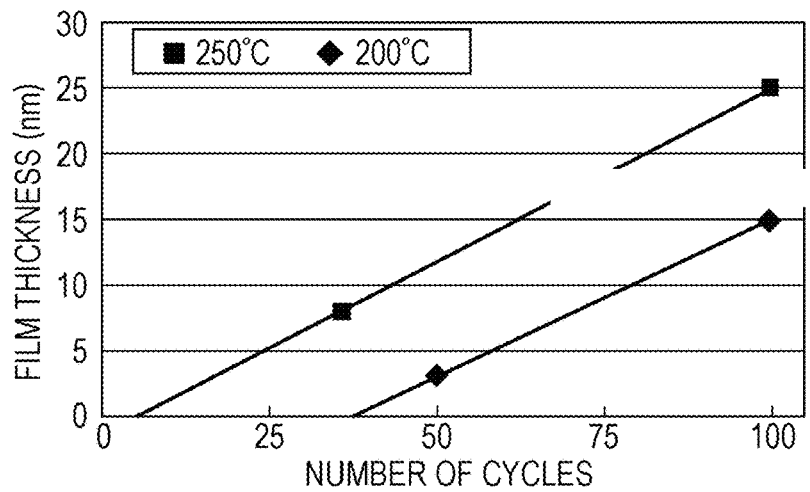
FIG. 9A is a graph illustrating incubation time generated at the time of preparing samples under plural temperature conditions in the example.

FIG. 9A is a graph illustrating results of cases in which the film-forming temperature was set to 200° C. and 250° C. In both the samples in which the film-forming temperature was 200° C. and 250° C., the film-forming pressure was 500 Pa, and the $B_2H_6$ gas supply time per cycle was 5 seconds. The vertical axis of the graph in FIG. 9A represents the film thickness in units of nm while the horizontal axis thereof represents the number of cycles.

In the sample in which the film-forming temperature was 200° C., film formation started in 37 cycles. That is, the incubation time, which is an intercept of the horizontal axis, is 37 cycles, and the film-forming rate, which is a tilt of the graph, is 0.23 nm/cycle. In the sample in which the film-forming temperature was 250° C., the incubation time is 5 cycles, and the film-forming rate is 0.26 nm/cycle. In this manner, it was found that, the higher the film-forming temperature became, the shorter the incubation time became, that is, the lower the film-forming temperature became, the longer the incubation time became.

Figure 9B:
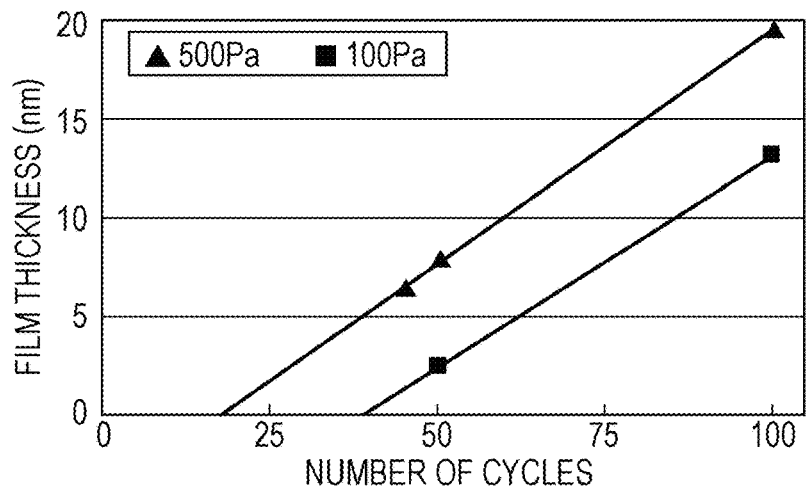
FIG. 9B is a graph illustrating incubation time generated at the time of preparing samples under plural pressure conditions in the example.

FIG. 9B is a graph illustrating results of cases in which the film-forming pressure was set to 100 Pa and 500 Pa. In both the samples in which the film-forming pressure was 100 Pa and 500 Pa, the film-forming temperature was 200° C., and the $B_2H_6$ gas supply time per cycle was 10 seconds. The vertical axis of the graph in FIG. 9B represents the film thickness in units of nm while the horizontal axis thereof represents the number of cycles.

In the sample in which the film-forming pressure was 100 Pa, the incubation time is 38 cycles, and the film-forming rate is 0.21 nm/cycle. In the sample in which the film-forming pressure was 500 Pa, the incubation time is 17 cycles, and the film-forming rate is 0.23 nm/cycle. In this manner, it was found that, the higher the film-forming pressure became, the shorter the incubation time became, that is, the lower the film-forming pressure became, the longer the incubation time became.

Figure 9C:
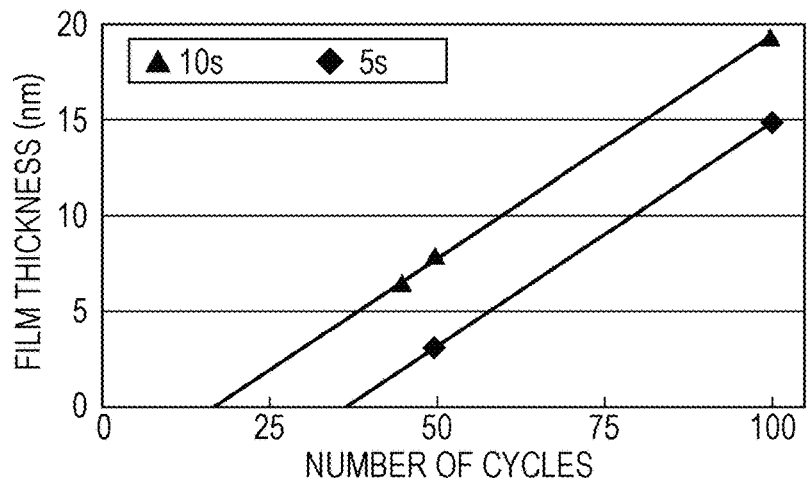
FIG. 9C is a graph illustrating incubation time generated at the time of preparing samples under plural supply time conditions in the example.

FIG. 9C is a graph illustrating results of cases in which the $B_2H_6$ gas supply time per cycle was set to 5 seconds and 10 seconds. In both the samples in which the $B_2H_6$ gas supply time per cycle was 5 seconds and 10 seconds, the film-forming temperature was 200° C., and the film-forming pressure was 500 Pa. The vertical axis of the graph in FIG. 9C represents the film thickness in units of nm while the horizontal axis thereof represents the number of cycles.

In the sample in which the $B_2H_6$ gas supply time per cycle was 5 seconds, the incubation time is 37 cycles, and the film-forming rate is 0.23 nm/cycle. In the sample in which the $B_2H_6$ gas supply time per cycle was 10 seconds, the incubation time is 17 cycles, and the film-forming rate is 0.23 nm/cycle. In this manner, it was found that, the longer the $B_2H_6$ gas supply time per cycle became, the shorter the incubation time became, that is, the shorter the $B_2H_6$ gas supply time per cycle became, the longer the incubation time became.

As described with reference to FIG. 9A, in the growth of the W film on the TiN film, the result in which, the lower the film-forming temperature becomes, the longer the incubation time becomes, is consistent with the observation fact about the growth of the W film on the Cu film described with reference to FIG. 8. That is, it is estimated that, in the growth of the W film on the conductive film such as the Cu film and the TiN film, the incubation time can be extended by lowering the film-forming temperature.

Similarly, it can be said that, in the growth of the W film on the conductive film, the incubation time can be extended by lowering the film-forming pressure or shortening the supply time of the reducing gas such as $B_2H_6$ gas per cycle.

Accordingly, in a case of forming the W film selectively on the insulating surface of the wafer including the insulating surface and the conductive surface, by at least one out of setting the film-forming temperature to a temperature in an appropriately low temperature range, setting the film-forming pressure to pressure in an appropriately low pressure range, and setting the reducing gas supply time per cycle to time in an appropriately short time range, the selection ratio can be improved.

The film-forming temperature (temperature at which the wafer is heated) is set to a temperature in a range from 150 to 300° C., preferably in a range from 160 to 200° C., such as 175° C. In a case in which the film-forming temperature is lower than 150° C., film formation on the insulating film will be difficult. In a case in which the film-forming temperature is higher than 300° C., film formation on the conductive film will easily occur, which makes it difficult to improve the selection ratio. To facilitate formation of the W film on the insulating film at a high selection ratio, the film-forming temperature is more preferably in a range from 160 to 200° C.

The film-forming pressure (pressure in the processing chamber housing the wafer) is set to pressure in a range from 1 to 1000 Pa, preferably in a range from 10 to 500 Pa, such as 50 Pa. In a case in which the film-forming pressure is lower than 1 Pa, more time will be required to set a predetermined pressure value, which causes the throughput to be lowered. In a case in which the film-forming pressure is higher than 1000 Pa, the incubation time will be short.

The reducing gas supply time to the wafer per cycle is set to time in a range from 1 to 60 seconds, preferably in a range from 10 to 30 seconds, such as 20 seconds. The reducing gas supply time to the wafer per cycle is preferably shorter. In a case in which the reducing gas supply time to the wafer per cycle is longer than 60 seconds, the incubation time will be short.

The reducing gas supply flow rate to the wafer is set to a flow rate in a range from 1 to 15000 sccm, preferably in a range from 6000 to 10000 sccm, such as 8000 sccm. In a case in which the supply flow rate is less than 1 sccm, the deposition rate will decrease, and the throughput is thus lowered. In a case in which the supply flow rate is more than 15000 sccm, the incubation time will be short.

In accordance with the selection ratio for forming the W film selectively on the insulating surface of the wafer, at least one of the processing conditions in the reducing gas supply step, that is, the temperature at which the wafer is heated, the pressure in the processing chamber housing the wafer, the reducing gas supply flow rate to the wafer, and the reducing gas supply time to the wafer (per cycle), can be selected to be an appropriate condition.

It is probable that the incubation time at the time of growth of the W film exists not only in Cu and TiN but also in other various metal materials such as Al, Ti, Ta, and TaN. Accordingly, it is probable that, when the W film is formed selectively on the insulating surface, various metal materials can be used as a material constituting the conductive surface, which is an area in which the W film is not formed (the material constituting the conductive surface preferably includes any of copper (Cu), aluminum (Al), titanium (Ti), titanium nitride (TiN), tantalum (Ta), and tantalum nitride (TaN), for example).

One reason for generating selection growth on the insulating film may be that, as described above, the incubation time is extended for growth of the W film on the conductive film, that is, that growth of the W film on the conductive film is difficult to be generated. Another reason for generating selection growth on the insulating film may be that growth of the W film on the insulating film is easy to be generated.

To the insulating surface and the conductive surface of the initial wafer, the reducing gas is first supplied. It is estimated that the B-containing layer, which is a layer formed by supply of the reducing gas, is easier to be formed on the insulating surface than on the conductive surface, that is, the B-containing layer is formed selectively on the insulating surface, and as a result, the W film is easier to be formed on the insulating surface than on the conductive surface, that is, the W film is formed selectively on the insulating surface.

The reason why the B-containing layer is easier to be formed on the insulating film may be as follows, for example. $B_2H_6$ is a molecule into which borane which does not satisfy the octet rule ($BH_3$) is dimerized for stabilization. Also, the insulating film 600 of the wafer 200 is made of SiO, for example, and the O atom contained in SiO has an unshared electron pair. It is probable that an atomic group containing B and H (one example thereof may be $BH_3$) can exist in a more stable manner when the atomic group is subject to coordinate bond with the O atom contained in SiO constituting the insulating surface and satisfies the octet rule. Accordingly, it is estimated that the B-containing layer is easier to be formed selectively on the insulating surface.

Consequently, as the foundation on which the B-containing layer is easier to be formed selectively, an insulating film made of an insulating material containing an element having an unshared electron pair such as O and N is preferable. Examples of such a material are an SiO film, a silicon nitride film (SiN film), and a silicon oxynitride film (SiON film) (the material constituting the insulating surface preferably includes any of silicon oxide (SiO), silicon nitride (SiN), and silicon oxynitride (SiON)). Each of such films may contain C. That is, a silicon oxycarbide film (SiOC film), a silicon carbonitride film (SiCN film), and a silicon oxycarbonitride film (SiOCN film) can be used. The SiOC film, the SiCN film, and the SiOCN film can also be referred to as an SiO film as an SiO film containing C, an SiN film as an SiN film containing C, and an SiON film as an SiON film containing C, respectively. A composite film of these films can be used.

FIG. 3
123: EXTERNAL MEMORY DEVICE
122: INPUT/OUTPUT DEVICE
121*c*: MEMORY DEVICE
121*d*: I/O PORT
312, 322, 512, 522: MASS FLOW CONTROLLER
314, 324, 514, 524: VALVE
245: PRESSURE SENSOR
243: APC VALVE

246: VACUUM PUMP
207: HEATER
263: TEMPERATURE SENSOR
267: ROTATING MECHANISM
115: BOAT ELEVATOR
FIG. 4A
METAL-CONTAINING GAS
REDUCING GAS
INERT GAS
FIGS. 9A TO 9C
FILM THICKNESS
NUMBER OF CYCLES

What is claimed is:

1. A method of manufacturing a semiconductor device, comprising:
   (a) supplying reducing gas to an initial substrate having the insulating surface containing an element having an unshared electron pair and a conductive surface;
   (b) performing a cycle a predetermined number of times to form a metal film selectively on an insulating surface, the cycle comprising;
   (c) supplying the metal-containing gas to the substrate after (a); and
   (d) supplying the reducing gas to the substrate,
   wherein (c) and (d) are performed in a time-division manner.

2. The method according to claim 1, wherein the reducing gas is an inorganic borane-based gas.

3. The method according to claim 1, wherein the metal-containing gas is tungsten-containing gas, and the metal film is a tungsten film.

4. The method according to claim 1, wherein a processing condition in the supplying reducing gas is selected in accordance with a selection ratio at time of forming the metal film selectively on the insulating surface.

5. The method according to claim 4, wherein the processing condition is at least one out of a temperature at which the substrate is heated, pressure in a processing chamber housing the substrate, a supply flow rate of the reducing gas to the substrate, and supply time of the reducing gas to the substrate.

6. The method according to claim 5, wherein the temperature at which the substrate is heated is a temperature in a range from 150 to 300° C.

7. The method according to claim 5, wherein the pressure in a processing chamber housing the substrate is pressure in a range from 1 to 1000 Pa.

8. The method according to claim 5, wherein the supply flow rate of the reducing gas is a flow rate in a range from 1 to 15000 sccm.

9. The method according to claim 5, wherein the supply time of the reducing gas is time in a range from 1 to 60 seconds.

10. The method according to claim 1, wherein the predetermined number of times for performing the cycle is selected to be less than incubation time required until growth of the metal film on the conductive surface is started.

11. The method according to claim 2, wherein the inorganic borane-based gas is a diborane gas.

12. The method according to claim 2, wherein the inorganic borane-based gas is a triborane gas.

13. The method according to claim 1, wherein a time period of (b) is shorter than a time period of (c).

14. The method according to claim 1 further comprising:
   (e) supplying an inert gas to the substrate during (b),
      wherein (e) is performed consecutively.

* * * * *